United States Patent
Verdant et al.

(10) Patent No.: US 9,859,916 B1
(45) Date of Patent: Jan. 2, 2018

(54) MULTISTAGE NOISE SHAPING SIGMA-DELTA MODULATOR

(71) Applicant: Commissariat à l'Energie Atomique et aux Energies Alternatives, Paris (FR)

(72) Inventors: Arnaud Verdant, Saint-Nazaire-les-Eymes (FR); Mohammed-Saad Boutayeb, Casablanca (MA)

(73) Assignee: Commissariat à l'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 15/659,231

(22) Filed: Jul. 25, 2017

(51) Int. Cl.
*H03M 3/00* (2006.01)
*H03M 7/30* (2006.01)

(52) U.S. Cl.
CPC .............. *H03M 3/50* (2013.01); *H03M 3/39* (2013.01); *H03M 3/414* (2013.01); *H03M 7/3042* (2013.01)

(58) Field of Classification Search
CPC .......... H03M 3/50; H03M 3/39; H03M 3/414; H03M 7/3042
USPC ......................................... 341/143, 77, 155
See application file for complete search history.

(56) References Cited

U.S. PATENT DOCUMENTS

| 5,870,048 A | 2/1999 | Kuo et al. | |
|---|---|---|---|
| 7,450,045 B2* | 11/2008 | Liu | H03M 3/474 341/143 |
| 9,276,604 B2* | 3/2016 | Ceballos | H03M 3/30 |

OTHER PUBLICATIONS

Preliminary Search Report in French Patent Application No. 1657232 dated Apr. 26, 2017, 2 pages.
Ho, Chian C. et al.; Gain Mismatch Effect of Cascaded Sigma Delta Modulator Reduced by Serial Technique; Proceedings of the 1999 IEEE International Symposium on Circuits and Systems; vol. 2; May 30, 1999.
Zanbaghi, Ramin et al.; A 75-dB SNDR, 5-MHz Bandwidth Stage-Shared 2-2 MASH Delta Sigma Modulator Dissipating 16 mW Power; IEEE Transactions on Circuits and Systems I: Regular Papers; vol. 59, No. 8; Aug., 2012.

* cited by examiner

*Primary Examiner* — Khai M Nguyen
(74) *Attorney, Agent, or Firm* — Moreno IP Law LLC

(57) ABSTRACT

A sigma-delta modulator including at least first and second sub-modulators, each including an analog integration circuit, the analog integration circuit of the first sub-modulator having an output node connected to an input node of the analog integration circuit of the second sub-modulator, the modulator further comprising a coupling capacitor having a first electrode connected to an output node of the analog integration circuit of the second sub-modulator, and a comparator having its input coupled to the first electrode of the coupling capacitor by a first switch and to a second electrode of the coupling capacitor by a second switch.

4 Claims, 4 Drawing Sheets

→ # MULTISTAGE NOISE SHAPING SIGMA-DELTA MODULATOR

This application claims the priority benefit of French patent application number 16/57232, the content of which is hereby incorporated by reference in its entirety to the maximum extent allowable by law.

BACKGROUND

The present disclosure relates to the field of analog-to-digital converters, and more particularly, of sigma-delta converters.

DISCUSSION OF THE RELATED ART

A sigma-delta converter conventionally comprises a sigma-delta modulator and a digital filter. The analog signal to be digitized is applied at the modulator input and is sampled by the latter at a relatively high frequency (relative to the maximum frequency of the input signal), called oversampling frequency. The modulator generates, at the oversampling frequency, binary samples representative of the analog input signal. The output bit train of the sigma-delta modulator is processed by the digital filter which extracts therefrom a digital value over N bits (N being the quantization resolution of the sigma-delta converter), representative of the input signal. The number of binary samples, that is, the number of oversampling periods, necessary to generate a digital output value over N bits is designated with acronym OSR, for "Over Sampling Ratio".

The function of the sigma-delta modulator is to shape, on the one hand, the useful signal by means of its signal transfer function STF and, on the other hand, the quantization noise by means of its noise transfer function NTF. The STF is the transfer function linking the analog input signal to be digitized to the output signal of the modulator, and the NTF is the transfer function linking the quantization noise introduced by modulator to the output signal of the modulator. The NTF enables to reject the quantization noise out of the band of interest (containing the signal). The sigma-delta modulator thus forms a quantization noise shaping stage. The digital filter is designed to extract the signal from frequency bands where the attenuation of the quantization noise by the NTF is high (that is, where the signal is located). The signal transfer function, STF, is generally equal to 1, and the noise transfer function, NTF, is for example expressed, for a modulator of order p, as $NTF(z)=(1-z^{-1})^p$.

FIG. 1 is a simplified electric diagram illustrating, in the form of blocks, an example of a sigma-delta modulator of order 1.

The modulator of FIG. 1 comprises an input terminal A1 intended to receive analog input signal Vin to be digitized, and an output terminal A2 intended to supply a series of binary samples BS representative of signal Vin. The modulator of FIG. 1 comprises an analog integration circuit 101, a 1-bit analog-to-digital converter 103 and a feedback loop comprising a 1-bit digital-to-analog converter 105. Analog integration circuit 101 comprises a first input terminal connected to terminal A1 of application of signal Vin, and an output terminal A3 connected to the input of 1-bit analog-to-digital conversion circuit 103, for example, a comparator. The output of I-bit analog-to-digital converter 103 is connected to output A2 of the modulator, and is further coupled, via the feedback loop, to a second input terminal A4 of analog integration circuit 101. In this example, analog integration circuit 101 comprises a subtractor 107 having its positive input coupled to terminal A1 of application of signal Vin and having its negative input coupled to output terminal A4 of the feedback loop, and an analog integrator $Ia_1$ having its input connected to the output of subtractor 107 and having its output connected to input terminal A3 of 1-bit analog-to-digital converter 103.

For each cycle k of duration $T_{OSR}$ of a phase of conversion of analog input signal Vin into a digital output value, where $T_{OSR}$ designates the oversampling period of the converter, k is an integer in the range from 1 to OSR, and OSR is the number of successive cycles of the conversion phase, integration circuit 101 takes an analog sample Vin(k) of the input signal, and the modulator supplies, at the output of 1-bit analog-to-digital converter 103, a binary sample BS(k) of the output signal. More particularly, in the shown example, for each cycle k, integrator $Ia_1$ of circuit 101 receives on its input a signal equal to the difference between input signal Vin(k) and feedback signal BS(k−1) (converted to the analog field by 1-bit digital-to-analog converter 105). Output value $Ia_1(k)$ of integrator $Ia_1$ is accordingly updated, that is, incremented by value Vin(k)−BS(k−1), and then quantized by analog-to-digital converter 103 to provide output sample BS(k).

As a variation, analog integration circuit 101 may comprise a plurality of cascaded analog integrators. It may also comprise one or a plurality of subtractors, one or a plurality of summing circuits, and/or one or a plurality of weighting coefficients. Number p of analog integrators generally defines the order of the sigma-delta modulator. The higher order p of the modulator, the more number OSR of samples necessary to obtain a digital output value over N bits can be decreased (for identical quantization noise levels). On the other hand, sigma-delta modulators are all the more complex to form as their order is high (difficult stabilization).

The digital filter (not shown) of a sigma-delta converter conventionally comprises, according to the modulator structure, one or a plurality of digital integrators (generally at least as many as there are analog integrators in the modulator), for example, counters, and carries out a filtering function intended to extract the useful information from the bit train generated by the sigma-delta modulator.

The forming of sigma-delta modulators having an order greater than 1 is here more particularly considered.

SUMMARY

Thus, an embodiment provides a sigma-delta modulator comprising at least first and second sub-modulators, each comprising an analog integration circuit, the analog integration circuit of the first sub-modulator having an output node connected to an input node of the analog integration circuit of the second sub-modulator, the modulator further comprising a coupling capacitor having a first electrode connected to an output node of the analog integration circuit of the second sub-modulator, and a comparator having its input coupled to the first electrode of the coupling capacitor by a first switch and to a second electrode of the coupling capacitor by a second switch.

According to an embodiment, the modulator is capable of implementing a phase of conversion of an analog input signal into an output bit train, the conversion phase comprising a plurality of operating cycles, wherein, for each cycle of the conversion phase, during a first part of the cycle, the first and second switches are respectively off and on, and a binary value Y1 is read from the comparator output and, during a second part of the cycle, the first and second switches are respectively on and off, and a binary value Y2 is read from the comparator output, values Y1 and Y2 being then combined into an output bit of the modulator.

According to an embodiment, for each cycle of the conversion phase, the analog integration circuit of the second sub-modulator integrates a signal representative of the difference between binary value Y1 and an output signal of the analog integration circuit of the first sub-modulator.

According to an embodiment, for each cycle of the conversion phase, a feedback signal representative of binary value Y2 is subtracted from the signal integrated by the analog integration circuit of the second sub-modulator.

According to an embodiment, for each cycle of the conversion phase, the analog integration circuit of the first sub-modulator integrates a signal representative of the analog input signal.

According to an embodiment, for each cycle of the conversion phase, a feedback signal representative of the binary output value of the modulator is subtracted from the signal integrated by the analog integration circuit of the first sub-modulator.

According to an embodiment, the analog integration circuit of the first sub-modulator comprises at least two cascaded analog integrators, and at least one circuit achieving a weighted sum of the output values of said integrators, the output of the summing circuit forming the output of said analog integration circuit.

According to an embodiment, the analog integration circuit of the second sub-modulator comprises a single analog integrator having its input and its output respectively connected to the input and to the output of said analog integration circuit.

The foregoing and other features and advantages will be discussed in detail in the following non-limiting description of dedicated embodiments in connection with the accompanying drawings.

DETAILED DESCRIPTION OF THE PRESENT EMBODIMENTS

Figure 1:
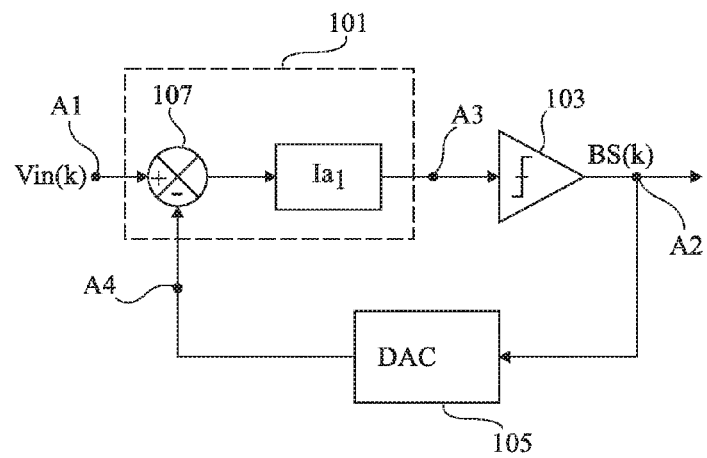
FIG. 1, previously described, schematically shows an example of a sigma-delta modulator of order 1.

The same elements have been designated with the same reference numerals in the different drawings. For clarity, only those elements which are useful to the understanding of the described embodiments have been shown and are detailed. In particular, the details of the forming of the digital filters of the described sigma-delta converters have not been shown, the forming of such filters being within the abilities of those skilled in the art on reading of the present description. In the present description, term "connected" is used to designate a direct electric connection, with no intermediate electronic component, for example, by means of one or a plurality of conductive tracks or conductive wires, and term "coupled" or term "linked" is used to designate an electric connection which may be direct (then meaning "connected") or indirect (that is, via one or a plurality of intermediate components).

Figure 2:
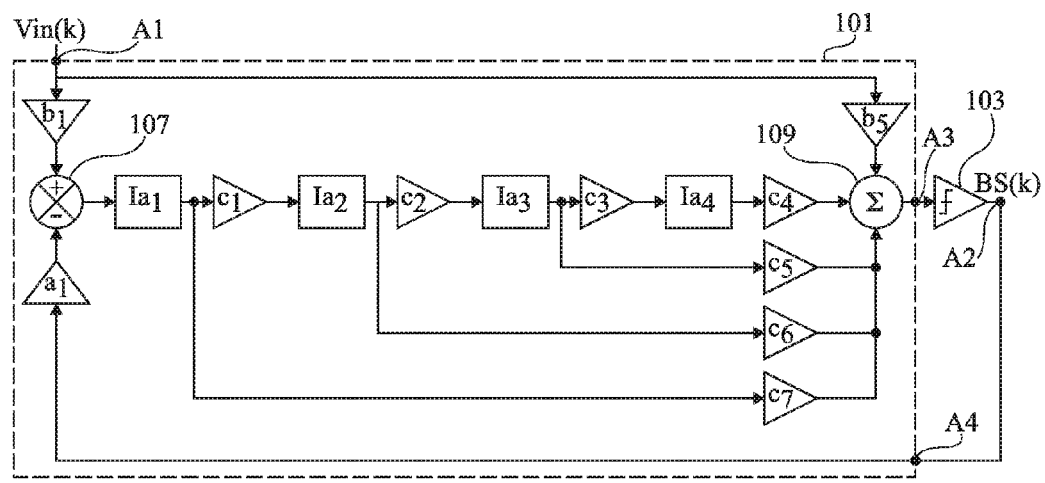
FIG. 2 schematically shows an example of a sigma-delta modulator of order 4.

FIG. 2 schematically illustrates in the form of blocks an example of a sigma-delta modulator of order 4.

The sigma-delta modulator of FIG. 2 differs from the sigma-delta modulator of FIG. 1 essentially by the architecture of its analog integration circuit 101. In the example of FIG. 2, analog integration circuit 101 comprises a subtractor 107, four cascaded analog integrators $Ia_1$, $Ia_2$, $Ia_3$ and $Ia_4$, and a summing circuit 109 ($\Sigma$). Each analog integrator comprises an input and an output, and for example has a $z^{-1}/(1-z^{-1})$ transfer function, that is, for each cycle, the integrated signal, or output signal of the integrator, is incremented by the value of the signal applied at the integrator input. In this example, subtractor 107 receives, on its positive input, input signal Vin(k) weighted by a coefficient $b_1$ and, on its negative input, feedback signal BS(k−1) weighted by a coefficient $a_1$. Integrator $Ia_1$ receives on its input the output signal of subtractor 107, that is, a signal equal to difference $b_1*Vin(k)-a_1*BS(k-1)$. Integrator $Ia_2$ receives on its input a signal equal to the output signal of integrator $Ia_1$ weighted by a coefficient $c_1$. Integrator $Ia_3$ receives on its input a signal equal to the output signal of integrator $Ia_2$ weighted by a coefficient $c_2$. Integrator $Ia_4$ receives on its input a signal equal to the output signal of integrator $Ia_3$ weighted by a coefficient $c_3$. Summing circuit 109 adds input signal Vin(k) weighted by a coefficient $b_5$ and the output signals of integrators $Ia_1$, $Ia_2$, $Ia_3$, and $Ia_4$, respectively weighted by coefficients $c_7$, $c_6$, $c_4$, and $c_4$. The output of summing circuit 109 is connected to output terminal A3 of circuit 101.

In this example, it is considered that input signal Vin and output signal BS of the modulator are normalized, that is, value 0 of binary signal BS corresponds to a voltage level equal to the smallest value that analog signal Vin can take, and value 1 of signal BS corresponds to a voltage level equal to the greater value that signal Vin can take. Thus, the feedback loop of the modulator is a simple conductive track coupling terminal A2 to terminal A4, and the feedback signal directly is signal BS. In the case where binary output signal BS is not at the same scale as input signal Vin, the feedback loop may comprise, as in the example of FIG. 1, a 1-bit digital-to-analog converter having its input coupled to terminal A2 and having its output coupled to terminal A4, the feedback signal then being the output signal of the 1-bit digital-to-analog converter.

Many alternative architectures of analog integration circuit 101 can be envisaged. Generally, analog integration circuit 101 of a sigma-delta modulator of order p greater than or equal to 1 may comprise p analog integrators $Ia_j$, j being an integer in the range from 1 to p, each analog integrator $Ia_j$ receiving on its input a signal equal to the difference between input signal Vin(k) weighted by a coefficient $b_j$ and feedback signal BS(k−1) weighted by a coefficient $a_j$, to which is added, if rank j of integrator $Ia_j$ is greater than 1, the output signal of the integrator $Ia_{j-1}$ of previous rank weighted by a coefficient $c_{j-1}$. Summing circuit $\Sigma$ adds input signal Vin(k) weighted by a coefficient $b_{p+1}$, the output signal of integrator $Ia_p$ of rank p weighted by a coefficient $c_p$ and, if p is greater than 1, the output signal(s) of the integrators of rank p−1, 1 being an integer in the range from 1 to p−1, respectively weighted by coefficients $c_{p+1}$. Some of the above-mentioned coefficients may be zero. For example, in the modulator of order 4 of FIG. 2, coefficients $b_2$, $b_3$, $b_4$, $a_2$, $a_3$ and $a_4$ are zero, and, in the modulator of order 1 of FIG. 1, coefficients b1, a1, and c1 are unit coefficients, and coefficient b2 is zero. Further, in the sub-modulator of order 2 MOD1 of FIG. 3 (which will be described hereafter), coefficients b1, a1, and c2 are unit coefficients, and coefficients a2, b2, and b3 are zero, and, in the sub-modulator of order 1 MOD1 of FIG. 3 (which will be described hereafter), coefficients b1, a1, and c1 are unit coefficients and coefficient b2 is zero.

In certain architectures of order p greater than or equal to 1, summing circuit Σ may further receive as an input feedback signal BS(k−1) weighted by a specific weighting coefficient.

Further, the analog integration circuit 101 of a sigma-delta modulator of order p greater than 1 may further comprise one or a plurality of analog feedbacks from the output of an analog integrator to the input of an upstream analog integrator, through a specific weighting coefficient.

Further, in an architecture of order p greater than 1, the output of an integrator of rank i may be added, through a specific weighting coefficient, to the input of a downstream integrator having a rank greater than or equal to i+2.

Further, delays may be introduced between the different stages of circuit 101, and/or between circuit 101 and converter 103.

A limitation of the above-mentioned architectures with a single noise shaping stage, that is, comprising a single feedback loop from the output of quantization stage 103 to the input of analog integration circuit 101, is that the forming of a modulator of high order is in practice complex to implement. In particular, a problem which is posed is that the modulator may have an unstable behavior for certain levels of the input signal.

To overcome this disadvantage, MASH-type ("Multi Stage Noise Shaping") sigma-delta modulators, that is, modulators of order p greater than 1 formed by the series connection of a plurality of sigma-delta sub-modulators having an order smaller than p, have been provided, where each sub-modulator may have a conventional single-stage noise shaping architecture of the above-described type, that is, comprising an analog integration circuit, a 1-bit analog-to-digital converter, and a feedback loop capable of comprising a digital-to-analog converter. The operating principle of MASH-type sigma-delta modulators is for example described in article "Sturdy MASH Δ-Σ modulator" of Maghari et al. (ELECTRONICS LETTERS 26 Oct. 2006 Vol. 42 No. 22). As an example, a MASH-type sigma-delta modulator of order 2 comprises a first sub-modulator of order 1, or upstream sub-modulator, for example, of the type described in relation with FIG. 1, receiving the analog signal to be digitized on its analog input, and a second sub-modulator of order 1, or downstream sub-modulator, for example, of the type described in relation with FIG. 1, receiving on its analog input a signal representative of the quantization error of the upstream sub-modulator. During a phase of conversion of the analog input signal into a digital value, each of the sub-modulators of order 1 supplies a train of OSR bits at the output of its 1-bit analog-to-digital converter, the two bit trains being recombined in a single train of OSR bits by a logic recombination circuit. The recombined bit train is digitally integrated by a digital filtering circuit generating a digital output value of the sigma-delta converter. More generally, MASH topologies can be applied whatever the orders of the series-coupled sub-modulators, and whatever the number of series-coupled sub-modulators. The sub-modulators are then coupled so that each sub-modulator of the series association of sub-modulators, except for the first sub-modulator, receives an input signal representative of the quantization error of the previous sub-modulator. An advantage of MASH-type sigma-delta modulators is that they enable to obtain high modulation orders, while doing away with the problems usually encountered (particularly, instability problems) in the forming of conventional sigma-delta modulators (with a single noise shaping stage).

Figure 3:
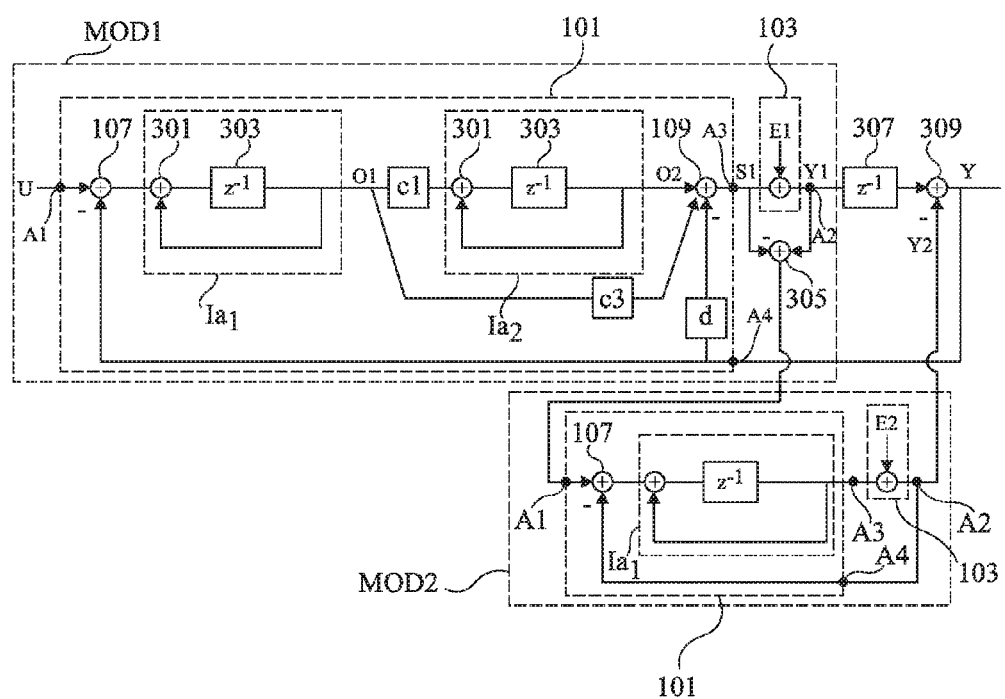
FIG. 3 schematically shows in the form of functional blocks an example of a multistage noise shaping sigma-delta modulator.

FIG. 3 schematically shows in the form of functional blocks an example of a MASH-type sigma-delta modulator.

In this example, the modulator is of MASH 2-1 type, that is, it comprises a first sigma-delta sub-modulator of order 2 MOD1, or upstream sub-modulator, followed by a second sigma-delta sub-modulator of order 1 MOD2, of downstream sub-modulator.

Sub-modulator MOD1 has a conventional topology of order 2 with a single noise shaping stage. It comprises, as in the above-described examples, an analog integration circuit 101 having a first input A1 intended to receive an analog input signal U to be converted, a 1-bit analog-to-digital converter 103 having its input coupled to an output A3 of analog integration circuit 101, and a feedback loop coupling output A2 of analog-to-digital converter 103 to a second input A4 of analog integration circuit 101. In this example, analog integration circuit 101 comprises a subtractor 107, two analog integrators $Ia_1$ and $Ia_2$, and a summing circuit 109. The positive input of subtractor 107 is coupled to input A1 of circuit 101, and the negative input of subtractor 107 is coupled to input A4 of circuit 101. The output of subtractor 107 is coupled to the input of analog integrator $Ia_1$, and the output of analog integrator $Ia_1$ is coupled to the input of analog integrator $Ia_2$ via a weighting coefficient c1. Summing circuit 109 adds output signal O1 of integrator $Ia_1$ weighted by a coefficient c3 to output signal O2 of integrator $Ia_2$, and subtracts from this sum feedback signal Y applied to input A4 of circuit 101, weighted by a coefficient d. The output of summing circuit 109 forms the output (terminal A3) of analog integration circuit 101 of sub-modulator MOD1, and is coupled to the input of analog-to-digital converter 103 of sub-modulator MOD1. In the example of FIG. 3, 1-bit analog-to-digital converter 103 of sub-modulator MOD1 is shown in the form of a summing circuit adding to output signal S1 (terminal A3) of analog integration circuit 101 of sub-modulator MOD1 a quantization noise E1 introduced by converter 103. In this example, each analog integrator $Ia_i$ comprises a summing circuit 301, and a delay operator 303 with a unit gain noted $Z^{-1}$. A first input of summing circuit 301 is coupled to the input of the analog integrator, the output of summing circuit 301 being coupled to the input of operator 303, and the output of operator 303 being coupled, on the one hand, to the output of the analog integrator and, on the other hand, to a second input of summing circuit 301 by a unit-gain positive feedback loop. At each operating cycle k of the sigma-delta converter, summing circuit 301 adds the signal received at cycle k at the input of integrator $Ia_i$ and a signal internal to integrator $Ia_i$ corresponding to the output signal of operator 301, that is, to the output value of integrator $Ia_i$ at the previous cycle.

Sub-modulator MOD2 has a conventional topology of order 1 of the type described in relation with FIG. 1. It comprises an analog integration circuit 101 comprising a first input A1 receiving an analog signal equal to the difference between output signal Y1 of analog-to-digital converter 103 of sub-modulator MOD1 and output signal S1 of analog integration circuit 101 of sub-modulator MOD1, that is, equal to the quantization error E1 introduced by analog-to-digital converter 103 of sub-modulator MOD1. To achieve this, the sigma-delta modulator of FIG. 3 comprises, between sub-modulators MOD1 and MOD2, a subtractor 305 having its positive input coupled to output A2 of sub-modulator MOD1, having its negative input coupled to output A3 of analog integration circuit 101 of sub-modulator MOD1, and having its output coupled to input A1 of analog integration circuit 101 of sub-modulator MOD2. Sub-modulator MOD2 further comprises a 1-bit analog-to-digital converter 103 having its input connected to an output terminal A3 of its analog integration circuit 101, and a feedback loop coupling output A2 of its analog-to-digital converter 103 to a second input A4 of its analog integration circuit 101. In this example, analog integration circuit 101 of sub-modulator MOD2 comprises a subtractor 107 and an analog integrator $Ia_1$. The positive input of subtractor 107 is coupled to input A1 of circuit 101, and the negative input of subtractor 107 is coupled to input A4 of circuit 101. The output of subtractor 107 is coupled to the input of analog integrator $Ia_1$. The output of analog integrator $Ia_1$ forms output A3 of analog integration circuit 101, and is coupled to the input of analog-to-digital converter 103. Analog integrator $Ia_1$ of sub-modulator MOD2 is for example identical or similar to integrator $Ia_1$ of sub-modulator MOD1. In the example of FIG. 3, 1-bit analog-to-digital converter 103 of sub-modulator MOD2 is shown in the form of a summing circuit adding to output signal (terminal A3) of analog integration circuit 101 of sub-modulator MOD2 a quantization noise E2.

In the example of FIG. 3, the sigma-delta modulator further comprises a unit-gain delay operator 307, noted $Z^{-1}$, and a subtractor 309. The input of operator 307 is coupled to output A2 of sub-modulator MOD1. The positive input of subtractor 309 is coupled to the output of operator 307. The negative input of subtractor 309 is coupled to output A2 of sub-modulator MOD2. In this example, the output of subtractor 309 forms the output of the sigma-delta modulator. The circuit formed by delay operator 307 and subtractor 309 recombines output bit trains Y1 of sub-modulator MOD2 and Y2 of sub-modulator MOD2 into an output bit train Y of the sigma-delta modulator, applied to the input of the digital filter (not shown) of the sigma-delta converter.

In the shown example, the feedback loop of sub-modulator MOD2 is a direct feedback loop, that is, directly coupling (or possibly via a 1-bit digital-to-analog converter) output A2 of sub-modulator MOD2 to input A4 of analog integration circuit 101 of sub-modulator MOD2. Conversely, the feedback loop of sub-modulator MOD1 is an indirect feedback loop, comprising the recombination circuit formed by elements 307 and 309. In other words, the feedback loop of sub-modulator MOD1 does not directly couple output A2 of sub-modulator MOD1 to input A4 of analog integration circuit 101 of sub-modulator MOD1, but it couples the output of the sigma-delta modulator (that is, the output of subtractor 309 supplying signal Y) to input A4 of analog integration circuit 101 of sub-modulator MOD1 (possibly via an analog-to-digital converter, not shown).

The following equations describe the response of the sigma-delta modulator of FIG. 3:

$$Y2 = z^{-1}E1 + (1-z^{-1})E2$$

$$Y1 = E1 - dY + c3\frac{z^{-1}}{1-z^{-1}}(U-Y) + c1\frac{z^{-1}}{(1-z^{-1})^2}(U-Y)$$

$$Y = z^{-1}Y1 - Y2$$

Figure 4:
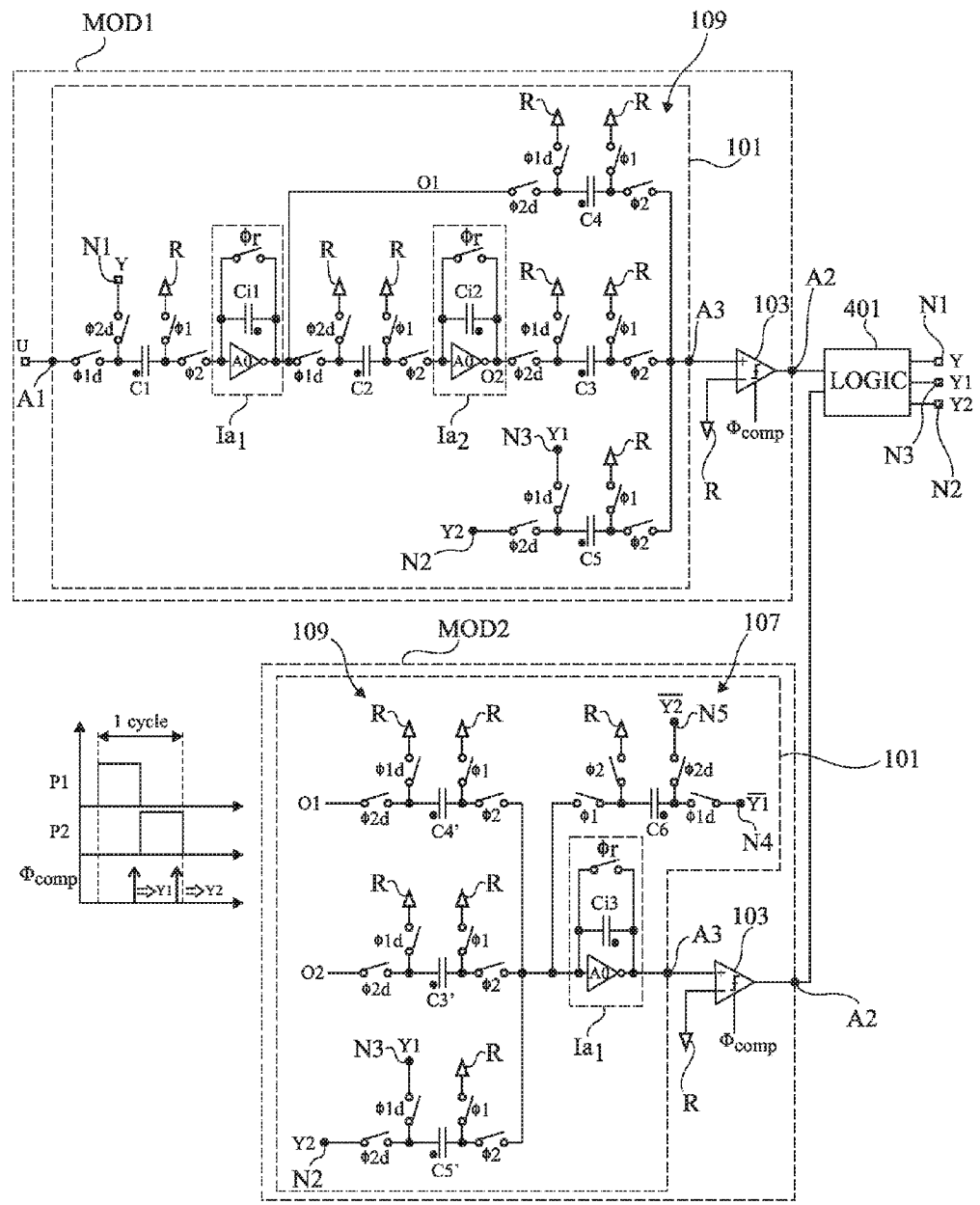
FIG. 4 is a detailed electric diagram of an example of implementation of the sigma-delta modulator of FIG. 3.

FIG. 4 is a detailed electric diagram of an embodiment of the sigma-delta modulator of FIG. 3.

In the example of FIG. 4, each of integrators $Ia_1$, respectively $Ia_2$, of sub-modulator MOD1 comprises an operational amplifier AO having its input coupled to the output by an integration capacitor $Ci1$, respectively $Ci2$. The input and the output of the operational amplifier respectively form the input and the output of the integrator. Similarly, integrator $Ia_1$ of sub-modulator MOD2 comprises an operational amplifier AO having its input coupled to its output by an integration capacitor $Ci3$. Each integrator further comprises, in parallel with its integration capacitor, a reset switch controlled by a signal Φr. In the present description, for simplification, the switches of the modulator are designated with the same reference numerals as their respective control signals. Thus, although the switches switching the different capacitors of the modulator are different, same designations are used for simultaneously controlled switches.

In this example, each of sub-modulators MOD1 and MOD2 comprises an analog integration circuit 101 and a 1-bit analog-to-digital converter 103 formed by a comparator having its input connected to an output terminal A3 of analog integration circuit 101 of the sub-modulator, and having its output connected to an output terminal A2 of the sub-modulator. In operation, an internal signal of each comparator switches from a high state to a low state according to whether the input signal of the comparator is higher or lower than a threshold, for example, equal to a reference potential applied to a reference node R of the circuit. The internal signal of the comparator is copied on its output terminal A2 at each rising or falling edge of a control signal Φcomp.

In sub-modulator MOD1, the analog integration circuit 101 is formed as follows. The output of integrator $Ia_1$ is coupled to a first electrode of a capacitor C2 by a first switch Φ1d, and the output of integrator $Ia_2$ is coupled to a first electrode of a capacitor C3 by a first switch Φ2d. The second electrode of capacitor C2 is coupled to the input of integrator $Ia_2$ by a first switch Φ2, and the second electrode of capacitor C3 is coupled to output terminal A3 of circuit 101 by a second switch Φ2. The first and second electrodes of capacitor C2 are further coupled to a node R of application of a reference potential, respectively via a second switch Φ2d and via a first switch Φ1. Further, the first and second electrodes of capacitor C3 are coupled to node R respectively via a second switch Φ1d and via a second switch Φ1. Analog integration circuit 101 of sub-modulator MOD1 further comprises a capacitor C1 having a first electrode coupled to input terminal A1 of the sub-modulator by a third switch Φ1d and having its second electrode coupled to the input of integrator $Ia_1$ by a third switch Φ2. The first and second electrodes of capacitor C1 are further respectively coupled to a node N1 receiving output signal Y of the modulator by a third switch Φ2d and to node R by a third switch Φ1. Analog integration circuit 101 of sub-modulator MOD1 further comprises a capacitor C4 having a first electrode coupled to the output of integrator $Ia_1$ by a fourth switch Φ2d and having its second electrode coupled to output terminal A3 of circuit 101 by a fourth switch Φ2. The first and second electrodes of capacitor C4 are further coupled to node R respectively by a fourth switch Φ1d and by a fourth switch Φ1. Analog integration circuit 101 of sub-modulator MOD1 further comprises a capacitor C5 having a first electrode coupled to node N2 receiving output signal Y2 of sub-modulator MOD2 via a fifth switch Φ2d and having a second electrode coupled to output terminal A3 of circuit 101 by a fifth switch Φ2. The first and second electrodes of capacitor C5 are further respectively coupled to a node N3 receiving output signal Y1 of sub-modulator MOD1 via a fifth switch Φ1d and to node R via a fifth switch Φ1.

The circuit formed by capacitors C4, C3, and C5 and by the switches Φ2d, Φ1d, Φ1, Φ2 associated with these capacitors is duplicated at the input of the analog integrator Ia$_1$ of sub-modulator MOD2. In other words, in addition to its analog integrator Ia$_1$, analog integration circuit 101 of sub-modulator MOD2 comprises: a capacitor C3' substantially identical to capacitor C3 (to within manufacturing dispersions) having a first electrode coupled to the output of integrator Ia$_2$ of sub-modulator MOD1 by a sixth switch Φ2d and having its second electrode coupled to the input of integrator Ia$_1$ of sub-modulator MOD2 by a sixth switch Φ2, the first and second electrodes of capacitor C3' being further coupled to node R respectively by a sixth switch Φ1d and by a sixth switch Φ1; a capacitor C4' substantially identical to capacitor C4 (to within manufacturing dispersions) having a first electrode coupled to the output of integrator Ia$_1$ of sub-modulator MOD1 by a seventh switch Φ2d and having its second electrode coupled to the input of integrator Ia$_1$ of sub-modulator MOD2 by a seventh switch Φ2, the first and second electrodes of capacitor C4' being further coupled to node R respectively by a seventh switch Φ1d and by a seventh switch Φ1; and a capacitor C5' substantially identical to capacitor C5 (to within manufacturing dispersions) having a first electrode coupled to node N2 by an eighth switch Φ2d and having its second electrode coupled to the input of integrator Ia$_1$ of sub-modulator MOD2 by an eighth switch Φ2, the first and second electrodes of capacitor C5' being further respectively coupled to node N3 by an eighth switch Φ1d and to node R by an eighth switch Φ1.

Analog integration circuit 101 of sub-modulator MOD2 further comprises a capacitor C6 having a first electrode coupled to a node N4 receiving a signal $\overline{Y1}$ complementary to output signal Y1 of sub-modulator MOD1 via a ninth switch Φ1d (node N4 is for example coupled to node N3 by an inverter) and having its second electrode coupled to the input of integrator Ia$_1$ of sub-modulator MOD2 by a ninth switch Φ1. The first and second electrodes of capacitor C6 are further respectively coupled to a node N5 receiving a signal $\overline{Y2}$ complementary to output signal Y2 of sub-modulator MOD2 via a ninth switch Φ2d (node N5 is for example coupled to node N2 by an inverter) and to node R by a ninth switch Φ2.

In this example, the output of integrator Ia$_1$ of sub-modulator MOD2 is connected to output terminal A3 of analog integration circuit 101 of sub-modulator MOD2.

The sigma-delta modulator of FIG. 4 further comprises a logic circuit 401 (LOGIC) comprising two binary inputs respectively coupled to output terminal A2 of 1-bit analog-to-digital converter 103 of sub-modulator MOD1 and to output terminal A2 of 1-bit analog-to-digital converter 103 of sub-modulator MOD2, and three binary outputs respectively coupled to nodes N1, N2, and N3 and supplying binary output signal Y1 of sub-modulator MOD1, binary output signal Y2 of sub-modulator MOD2, and the binary output signal Y of the modulator.

A timing diagram is shown in FIG. 4 to show the chaining in a cycle of two successive switching phases P1 and P2 of the modulator switches. During phase P1, switches Φ2 and Φ2d are turned on (made conductive), switches Φ1 and Φ1d being kept off (non-conductive). At the end of phase P1, switches Φ2 and Φ2d are turned off. During phase P2, switches Φ1 and Φ1d are turned on (made conductive), switches Φ2 and Φ2d being kept off (non-conductive). At the end of phase P2, switches Φ1 and Φ1d are turned off. At the end of each of phases P1 and P2, the internal signal of comparators 103 of sub-modulators MOD1 and MOD2 is sampled (rising edges of signal Φcomp) to generate signals Y1 and Y2.

In the embodiment of FIG. 4, the function of summing circuit 109 of FIG. 3 is implemented on the one hand by capacitors C4, C3, and C5 and the switches connected to these capacitors, and on the other hand by capacitors C4', C3', and C5' and the switches connected to these capacitors.

At each cycle k of a phase of conversion of analog input signal U into a digital value, during phase P1, a signal S1 resulting from the weighted sum of output signal O1 of integrator Ia$_1$, of output signal O2 of integrator Ia$_2$, and of output signal Y of the sigma-delta modulator, is generated on input node A3 of analog-to-digital converter 103 of sub-modulator MOD1, with S1=−(O2+c3*O1−d*Y), coefficients c3 and d being respectively set by the ratio of capacitances C3 and C4 and the ratio of capacitances C5 and C3. It should be noted that in this example, signal Y(k)=Y1(k−1)−Y2(k) is not directly applied to the input of the summing circuit, but is generated again by the latter in capacitor C5, based on signals Y1 and Y2. At the end of phase P1, signal S1 is quantized by comparator 103 of sub-modulator MOD1 to generate signal Y1. In parallel, during phase P1, signal S1 is further generated on the input node of integrator Ia$_1$ of sub-modulator MOD2 by the duplicated summing circuit comprising capacitors C4', C3', and C5' and the switches connected to these capacitors. The value of signal S1 thus adds to the output value of integrator Ia$_1$ of sub-modulator MOD2.

During phase P2 following phase P1, signal $\overline{Y1}$ is applied to the input of integrator Ia$_1$ of sub-modulator MOD2. Thus, at the end of the cycle, the output value of integrator Ia$_1$ of sub-modulator MOD2 has effectively been increased by a value corresponding to quantization noise E1 of analog-to-digital converter 103 of sub-modulator MOD1 (from which feedback signal Y2 of sub-modulator MOD2 due to the precharging of capacitor C6 to potential −$\overline{Y2}$ during phase P1 is subtracted).

In the example of FIG. 4, the function of subtractor circuit 107 of sub-modulator MOD1 of FIG. 3 is implemented by capacitor C1 and the switches associated with this capacitor, and the function of subtractor circuit 107 of sub-modulator MOD2 of FIG. 3 is implemented by capacitor C6 and the switches associated with this capacitor.

A disadvantage of the architecture of FIG. 4 is the hardware cost due to the duplicating, at the input of sub-modulator MOD2, of the capacitors of the summing circuit used in sub-modulator MOD1 to generate output signal S1 of analog integration circuit 101 of sub-modulator MOD1. Another disadvantage is due to the matching, which is inevitably imperfect, of the duplicated capacitors, which results in introducing an additional component of quantization noise E1 in the expression of output signal Y of the modulator.

Figure 5:
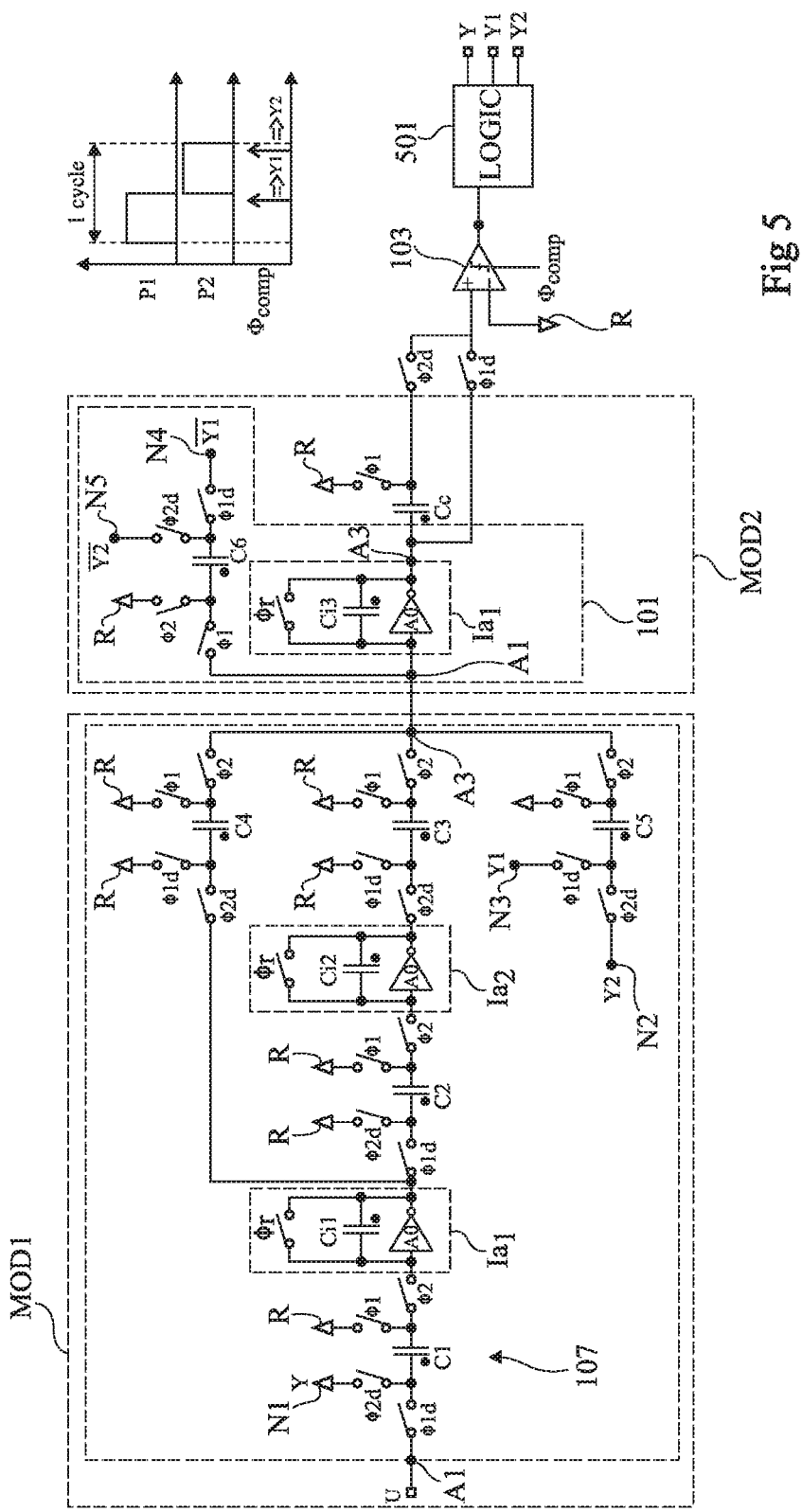
FIG. 5 is a detailed electric diagram illustrating an embodiment of a multistage noise shaping sigma-delta modulator.

FIG. 5 is a detailed electric diagram illustrating an embodiment of a multistage noise shaping sigma-delta modulator.

Functionally, the sigma-delta modulator of FIG. 5 is a MASH 2-I-type modulator identical or similar to the modulator of FIG. 3.

Structurally, the sigma-delta modulator of FIG. 5 comprises elements common with the sigma-delta modulator of FIG. 4. Only the differences between the two embodiments will be detailed hereafter.

Analog integration circuit 101 of sub-modulator MOD1 of the modulator of FIG. 5 is identical or similar to analog integration circuit 101 of sub-modulator MOD1 described in relation with FIG. 4.

Analog integration circuit 101 of sub-modulator MOD2 of FIG. 5 differs from analog integration circuit 101 of sub-modulator MOD2 of FIG. 4 essentially in that it comprises no replication of the output summing circuit of analog integration circuit 101 of sub-modulator MOD1. In other words, analog integration circuit 101 of sub-modulator MOD2 of FIG. 5 differs from analog integration circuit 101 of sub-modulator MOD2 of FIG. 4 essentially in that it does not comprise capacitors C4', C3' and C5' and the switches associated with these capacitors.

In the example of FIG. 5, the analog integration circuits 101 of sub-modulators MOD1 and MOD2 are directly series-coupled, that is, output terminal A3 of analog integration circuit 101 of sub-modulator MOD1 is connected to input terminal A1 of analog integration circuit 101 of sub-modulator MOD2 (corresponding to the input node of integrator $Ia_1$ of sub-modulator MOD2).

In the embodiment of FIG. 5, the sigma-delta modulator comprises a single 1-bit analog-to-digital converter 103, for example, a comparator identical or similar to comparators 103 of sub-modulators MOD1 and MOD2 of FIG. 4, shared by sub-modulators MOD1 and MOD2. The input of converter 103 is coupled to the output of analog integration circuit 101 of sub-modulator MOD2. More particularly, in the shown example, the sigma-delta modulator comprises a capacitor Cc having a first electrode connected to output node A3 of analog integration circuit 101 of sub-modulator MOD2 (corresponding to the output node of integrator $Ia_1$ of sub-modulator MOD2), and having its second electrode coupled to the input of analog-to-digital converter 103 by a switch Φ2d. The first electrode of capacitor Cc is further coupled to the input of converter 103 by a switch Φ1d. Further, the second electrode of capacitor Cc is coupled to node R by a switch Φ1.

The sigma-delta modulator of FIG. 5 further comprises a logic circuit 501 (LOGIC) comprising a binary input coupled to the output terminal of 1-bit analog-to-digital converter 103, and three binary outputs respectively coupled to nodes N1, N2, and N3 and supplying binary output signal Y1 of sub-modulator MOD1, binary output signal Y2 of sub-modulator MOD2, and binary output signal Y of the modulator.

A timing diagram is shown in FIG. 5 to show the chaining in a cycle of two successive switching phases P1 and P2 of the modulator switches. As in the example of FIG. 4, during phase P1, switches Φ2 and Φ2d are turned on, switches Φ1 and Φ1d being kept off (non-conductive). At the end of phase P1, switches Φ2 and Φ2d are turned off. During phase P2, switches Φ1 and Φ1d are turned on (made conductive), switches Φ2 and Φ2d being kept off (non-conductive). At the end of phase P2, switches Φ1 and Φ1d are turned off. At the end of each of phases P1 and P2, the internal signal of comparator 103 is sampled (rising edges of signal Φcomp) to generate signals Y1 and Y2.

In the implementation of FIG. 5, the function of summing circuit 109 of FIG. 3 is implemented by capacitors C4, C3, and C5 and the switches connected to these capacitors. At each cycle k of a phase of conversion of analog input signal U into a digital value, during phase P1, a signal S1 resulting from the weighted sum of output signal O1 of integrator $Ia_1$ of sub-modulator MOD1, of output signal O2 of integrator $Ia_2$ of sub-modulator MOD1, and of output signal Y of the sigma-delta modulator is generated on output node A3 of analog integration circuit 101 of sub-modulator MOD1, with S1=−(O2+c3*O1−d*Y). Signal S1 is applied to input node A1 of analog integration circuit 101 of the downstream sub-modulator MOD2, that is, in the shown example, to the input of integrator $Ia_1$ of sub-modulator MOD2. Signal S1 is thus integrated by integrator $Ia_1$ of sub-modulator MOD2, that is, during phase P1, the value of integrator $Ia_1$ is incremented by value S1. Prior thereto, during phase P2 of the previous cycle during which switches Φ1 are conductive, capacitor Cc is charged to the output value of integrator $Ia_1$. Thus, during the next phase P1 (Φ1 off), output coupling capacitor Cc introduces at the input of comparator 103 a voltage shift with respect to the current output value of integrator $Ia_1$ equal to the output value of integrator $Ia_1$ at the end of the previous cycle. In other words, during phase P1, the voltage variation observed at the input of comparator 103 due to coupling capacitor Cc corresponds to quantity S1. At the end of phase P1, the value S1 observed on the second electrode of capacitor Cc is quantized by comparator 103 to generate signal Y1.

During phase P2 following phase P1, signal $\overline{Y1}$ is applied to the input of integrator $Ia_1$ of sub-modulator MOD2 (node N4). Thus, during phase P2, the output value of integrator $Ia_1$ of sub-modulator MOD2 is incremented by a value corresponding to the quantization noise E1 introduced by analog-to-digital converter 103 during the quantization of signal S1, from which feedback Y2 is subtracted (node N5). At the end of phase P2, the output signal of integrator $Ia_1$ of sub-modulator MOD2 is directly quantized by comparator 103 (without passing through coupling capacitor Cc) to obtain signal Y2.

Thus, functionally, the circuit of FIG. 5 behaves substantially in the same way as the circuit of FIG. 3. However, in the implementation of FIG. 5, rather than duplicating the circuit for generating signal S1 at the input of sub-modulator MOD2 as in the implementation of FIG. 4, it is provided to reconstruct signal S1 by diverting the output signal of integrator $Ia_1$ of downstream modulator MOD2 through coupling capacitor Cc.

An advantage of the embodiment of FIG. 5 is that signal S1 is not duplicated, which, in addition to the advantage in terms of hardware cost due to the suppressing of capacitors C4', C3', C5' and of their switches, enables, during the generation of quantization error signal E1=Y1−S1, to avoid risks of lack of integrity of signal S1 due to a mismatch of the duplicated capacitors.

Another advantage of the implementation of FIG. 5 is that it enables to spare a 1-bit analog-to-digital converter with respect to the implementation of FIG. 4.

Specific embodiments have been described. Various alterations, modifications, and improvements will occur to those skilled in the art. In particular, the described embodiments are not limited to the example of MASH 2-I-type sigma-delta modulator architecture described in relation with FIGS. 3 and 5. More generally, the provided solution, implementing an analog circuit for diverting the output signal of an analog integration circuit 101 of a downstream sub-modulator to reconstruct an output signal of an analog integration circuit 101 of an upstream sub-modulator may be used in any type of sigma-delta modulator, comprising at least two cascaded sub-modulators.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A sigma-delta modulator comprising at least first and second analog integration circuits each comprising at least one analog integrator, each analog integrator comprising an operational amplifier having its input coupled to its output by an integration capacitor, the first analog integration circuit having an output node connected to an input node of the second analog integration circuit, the modulator further comprising a coupling capacitor different from said integration capacitors, the coupling capacitor having a first electrode connected to an output node of the second analog integration circuit, and a comparator having its input coupled to the first electrode of the coupling capacitor by a first switch and to a second electrode of the coupling capacitor by a second switch, the modulator being capable of implementing a phase of conversion of an analog input signal into an output bit train, the conversion phase comprising a plurality of operating cycles, each divided into first and second successive phases, wherein, for each cycle of the conversion phase:

during the first phase of the cycle:

the first analog integration circuit integrates a signal representative of the difference between the analog input signal and a first feedback signal, and supplies an output signal S1 on its output node;

the second analog integration circuit only integrates signal S1;

the first and second switches are respectively turned off and on, so that only signal S1 is transmitted to the input of the comparator via the coupling capacitor; and a binary value Y1 corresponding to 1-bit quantized signal S1 is read from the output of the comparator, and, during the second phase of the cycle:

the second analog integration circuit integrates a signal representative of the difference between a second feedback signal and binary value Y1;

the first and second switches are respectively turned on and off, so that the output signal of the second analog integration circuit is applied to the input of the comparator; and a binary value Y2 corresponding to the 1-bit quantized output signal of the second analog integration circuit is read from the output of the comparator, values Y1 and Y2 being then combined into one output bit of the modulator.

2. The modulator of claim 1, wherein the second electrode of the coupling capacitor is further coupled to a node of application of a reference potential by a third switch, the third switch being off during the first phase of each cycle of the conversion phase and on during the second phase of each cycle of the conversion phase.

3. The modulator of claim 1, wherein the first analog integration circuit comprises at least two cascaded analog integrators, and at least one circuit achieving a weighted sum of the output values of said integrators, the output of the summing circuit forming the output of said analog integration circuit.

4. The modulator of claim 1, wherein the analog integration circuit of the second sub-modulator comprises a single analog integrator having its input and its output respectively connected to the input and to the output of said analog integration circuit.

* * * * *